United States Patent [19]

Disser

[11] Patent Number: 4,746,813

[45] Date of Patent: May 24, 1988

[54] SWITCHING CIRCUIT FOR INDUCTIVE LOAD WITH RFI SUPPRESSION

[75] Inventor: Robert J. Disser, Dayton, Ohio

[73] Assignee: General Motors Corporation, Detroit, Mich.

[21] Appl. No.: 58,248

[22] Filed: Jun. 4, 1987

[51] Int. Cl.$^4$ .................. H03K 17/60; H03K 3/01; H03K 17/687; G05F 1/40

[52] U.S. Cl. ................................. 307/248; 307/270; 307/300; 307/570; 323/289

[58] Field of Search .............. 307/270, 454, 570, 571, 307/300; 323/289; 361/88–93

[56] References Cited

U.S. PATENT DOCUMENTS

| | | | |
|---|---|---|---|
| 4,540,893 | 9/1985 | Bloomer | 307/248 |
| 4,594,636 | 6/1986 | Hamer et al. | 325/289 |
| 4,709,160 | 11/1987 | Kinoshita | 307/571 |

Primary Examiner—Stanley D. Miller
Assistant Examiner—B. P. Davis

Attorney, Agent, or Firm—Robert M. Sigler

[57] ABSTRACT

A switching circuit for and inductive load with a parallel freewheeling diode comprises a semiconductor switch in series therewith across a power supply and a switch control effective to change the semiconductor switch from a nonconducting to a conducting state by sourcing current to the control electrode to charge the internal capacitance. The switch control means is responsive to the load voltage to produce a lower current rate to the control electrode while the load voltage indicates a condition other than reverse bias for the freewheeling diode in order to reduce RFI by slowing the switching of the semiconductor switch while the freewheeling diode is recovering and a higher current rate as soon as the load voltage indicates reverse bias for the freewheeling diode in order to minimize time spent in the active conduction region of the semiconductor switch and thus minimize resultant heat generation during switching.

4 Claims, 1 Drawing Sheet

SWITCHING CIRCUIT FOR INDUCTIVE LOAD WITH RFI SUPPRESSION

BACKGROUND OF THE INVENTION

This invention relates to the switching of an inductive load by a semiconductor switch, particularly by a MOSFET. Switching arrangements of this type generally include a parallel freewheeling diode for the inductive load—that is, a diode in parallel with the load but oriented to normally conduct current in the opposite direction to the normal polarity of the semiconductor switch. The freewheeling diode protects the semiconductor switch from high voltage transients produced as the switch attempts to abruptly change the current through the inductive load.

This invention is further directed, although not limited, to applications wherein the semiconductor switch handles high currents and is repeatedly activated between its nonconducting and full conducting states, such as in a PWM (pulse width modulation) or duty cycle control of motor operating voltage. Good design of power semiconductor switches in such applications provides for the fastest possible switching in order to minimize the time spent by the semiconductor switch in the active conducting region between the nonconducting and full conducting or saturation conditions and thus minimize heat generation. Minimal heat generation produces lower costs and bulk, since heat sinks can be smaller and devices need not be as insensitive to high temperature.

However, fast switching of inductive loads with freewheeling diodes also tends to generate high radio frequency interference (RFI), since the diode, as it is changing from a reverse biased state to a forward biased state, and vice versa, has a certain recovery time in which it may act as a short circuit. During this time, there is essentially no load resistance for the semiconductor switch and its switching rate is limited mainly by the rate at which current is supplied to its control electrode to charge or discharge its internal capacitance. If this rate is high, sharp voltage transients may be produced in the circuit which are rich in higher harmonics in the radio frequency range. Thus there is a benefit in controlling the switching process over time to obtain a slower switching rate during that portion of the switching process most susceptible to RFI generation and a faster switching rate during that portion of the switching process not so susceptible.

The prior art includes a patent to Bloomer U.S. Pat. No. 4,540,893, issued Sept. 10, 1985, in which the current to the control electrode of a semiconductor switch is made higher below the voltage indicating the threshold of conduction and above the voltage indicating full conduction or saturation of the switch, with a lower current between these voltages through the active conducting region. This patent is not specifically directed to the switching of inductive loads and mentions nothing of the specific difficulties due to the freewheeling diodes used with such loads. In addition, although it appears to have the potential for reducing RFI, it does so by slowing the switching rate during the entire time that the semiconductor switch spends traversing the active conducting region, with consequent higher heat generation, expense and bulk.

SUMMARY OF THE INVENTION

This invention reduces RFI in a circuit of the type described above by slowing the switching process only during that portion of the switching process in which the freewheeling diode is recovering and speeding the switching process for the remainder of its duration.

The invention is thus a switching circuit comprising, in combination, an electric power supply having a supply voltage, an inductive load with a parallel freewheeling diode, a semiconductor switch connected in series with the inductive load across the electric power supply, and switch control means. The switch control means is effective to change the semiconductor switch from a nonconducting to a full conducting state by sourcing current to the control electrode to charge the internal capacitance and raise the control voltage. The switch control means is responsive to the load voltage to produce a lower current rate to the control electrode while the load voltage indicates a condition other than reverse bias for the freewheeling diode and a higher current rate as soon as the load voltage indicates reverse bias for the freewheeling diode.

Further details and advantages of the invention will be apparent from the accompanying drawings and following description of a preferred embodiment.

DESCRIPTION OF THE PREFERRED EMBODIMENT

Figure 1:
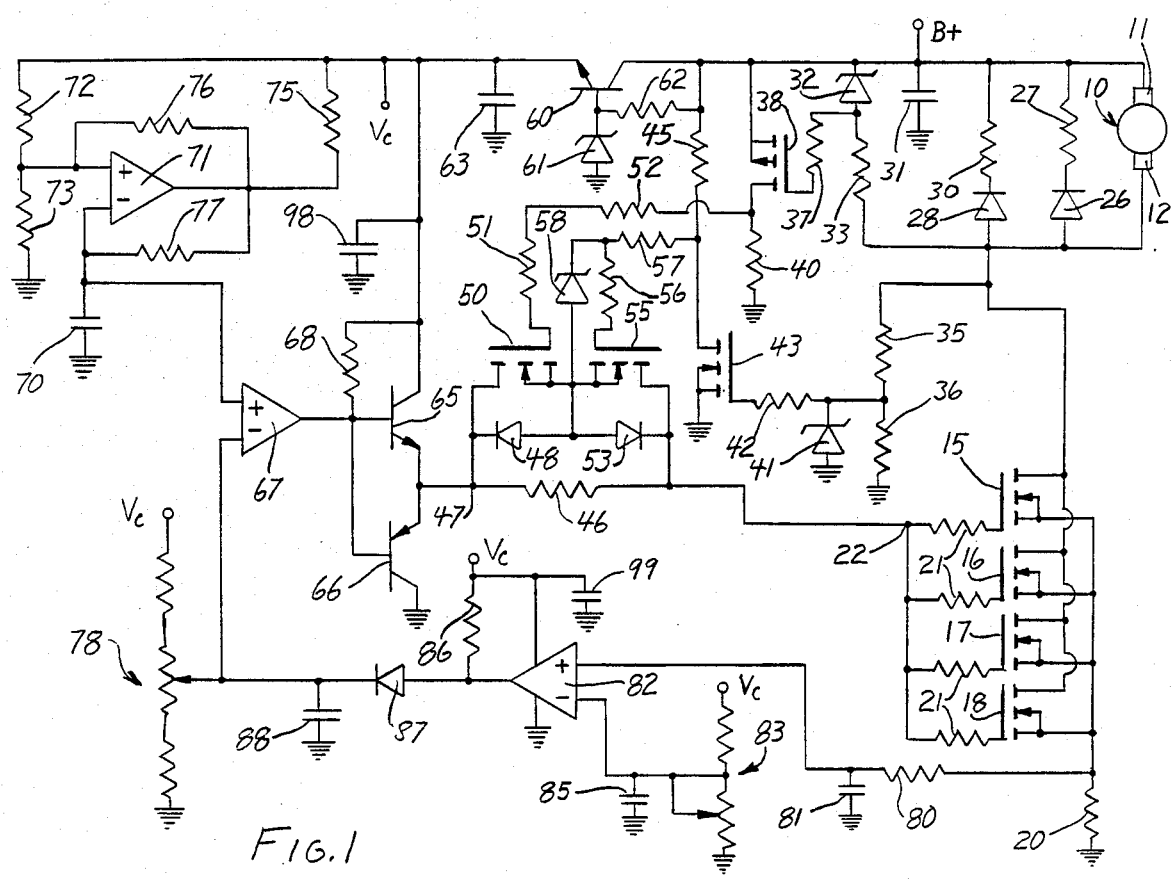
FIG. 1 is a circuit diagram of a circuit according to the invention.

Referring to FIG. 1, an electric switching circuit includes an electric power supply of standard circuitry, not shown, which is capable of supplying current and is characterized by a supply voltage B+ relative to ground. A permanent magnet, DC motor 10 has one armature terminal 11 connected to the supply voltage terminal B+ and another armature terminal 12 connected in series with the drains of four parallel enhancement mode MOSFETs 15–18. FETs 15–18 are semiconductor switches having sources connected through a resistor 20 to ground. Resistor 20 is a current sensing resistor of very small resistance (0.01 ohm, 15 watt) which is used in an armature current limiting circuit which will be described at a later point in this specification. The drain and source of each FET comprise main electrodes which carry motor armature current and define a switch voltage therebetween across the FET. Each of FETs 15–18 further comprises a gate which acts as a control electrode defining a control voltage from gate to source to determine the conducting state of the FET. The control electrodes are each connected through a resistor 21 (100) to a junction 22, so that a single voltage may be applied to all the FET gates simultaneously. The FETs are thus identically connected in the circuit to act as a single semiconductor switch with greater current handling capability than a single FET for the armature current to motor 10.

Figure 2:
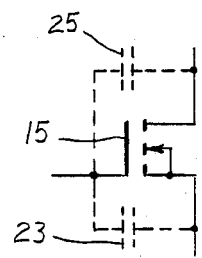
FIG. 2 shows a circuit representation of a semiconductor switch for use in the circuit of FIG. 1.

Each of FETs 15–18 has a gate-to-source capacitance 23 and a gate-to-drain capacitance 25 as indicated in FIG. 2. These capacitances, with the gate-to-drain capacitance 25 multiplied by the transconductance of the FET, introduce a time delay between a change in voltage at junction 22 and a corresponding change in the control voltage on the gate of the FET, due to the necessity of charging or discharging the capacitances. This time delay allows some control over the speed of the switching process by variation of the charging current.

A diode 26 has an anode connected to terminal 12 of motor 10 and a cathode connected through a resistor 27 (0.01 ohm, 5 watt) to terminal 11 of motor 10. Likewise, an identical diode 28 and resistor 30 are similarly connected with respect to motor 10. Diodes 26 and 28 are freewheeling diodes for motor 10. Resistors 27 and 30 are of extremely small resistance and therefore, along with resistor 20, produce little current limiting through FETs 15–18 during those times when diodes 26 and 28 are recovering from forward to reverse bias and momentarily become short circuits.

A capacitor 31 (470 uF) is connected across the power supply between terminal B+ and ground. A zener diode 32 (30 volt) and resistor 33 (47 ohm) are connected in series from terminal B+ to the drains of FETs 15–18 in parallel with motor 10; and a pair of resistors 35 (100 ohm) and 36 (2.7K) is connected in series from the drains of FETs 15–18 to ground. A resistor 37 (30 ohm) connects the anode of zener diode 32 to the gate of a FET 38 having a source connected to terminal B+ and a drain connected through a resistor 40 (1.3K) to ground. The junction of resistors 35 and 36 is connected to ground through a zener diode 41 (5.1 volt) and through a resistor 42 (200 ohm) to the gate of a FET 43 having a grounded source and a drain connected through a resistor 45 (4.3K) to terminal B+.

FET 38, connected as described, is nonconducting when the voltage on armature terminal 12 of motor 10 is less than the threshold voltage of FET 38 below B+ and conducting when that voltage is more than the threshold voltage below B+. FET 38 is thus nonconducting while FETs 15–18 are nonconducting and as they begin to conduct, before the freewheeling diodes 26 and 28 have a chance to recover from their forward bias condition to a reverse bias condition. As freewheeling diodes 26 and 28 recover and become reverse biased, the voltage on terminal 12 of motor 10 is allowed to fall below B+ by the threshold voltage of FET 38 and switch it into a conducting condition. FET 43 is in a conducting condition while FETs 15–18 are nonconducting and as FETs 15–18 begin conducting. When FETs 15–18 come out of saturation and their drain-to-source voltage rises above the threshold voltage of FET 43, the latter switches to a conducting state.

Junction 22 is connected through a resistor 46 (1K) to the drain of a FET 50 having a source connected through series resistors 51 (30 ohm) and 52 (750 ohm) to the drain of FET 38. Junction 22 is connected to the drain of a FET 55 having a gate connected through series resistors 56 (30 ohm) and 57 (2.4K) to the drain of FET 43. The sources of FETs 50 and 55 are connected together and through a zener diode 58 (9.1 volt) to the junction of resistors 56 and 57. FETs 50 and 55 include internal antiparallel diodes 48 and 53, respectively, oriented as shown in FIG. 1 with their cathodes connected to the drains of their respective FETs. Resistor 46 and FET 50 form a junction labeled 47 in FIG. 1.

In operation, assuming that a low voltage is applied to junction 47 and FETs 15–18 are in a nonconducting state, FET 43 is conducting, which turns off FET 55. FET 38 is nonconducting, which allows FET 50 to be nonconducting. If the voltage at junction 47 is sent high, current flows through resistor 46 and resistors 21 in series therewith to charge the internal capacitances of FETs 15–18 and start their gate voltages rising. The resistance of resistor 46, 1K, is relatively high, which produces a relatively small charging current and causes a relatively slow charge of the internal capacitances.

Figure 4:
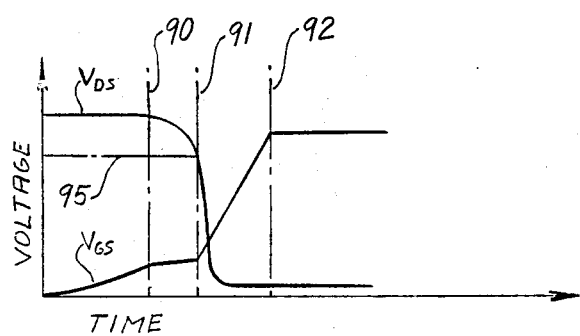

When the gate voltage of FETs 15–18 reaches the threshold voltage, they begin to conduct; and their drain voltage begins to fall. This is shown in FIG. 4 at the vertical dashed line 90. At this point the current therethrough, modified by the transconductance of the FETs, causes a slight additional slowing of the charging, although this is not important to the invention, since the charging rate of the slow portion of the FET switching process can be controlled through the value of resistor 46. It should be noted that it is during this portion of the switching process that freewheeling diodes 26 and 28 are recovering and may momentarily become short circuits. The relatively slow charging of the internal capacitances of FETs 15–18 prevents the FETs from immediately switching on hard with insufficient load impedance.

Figure 3:
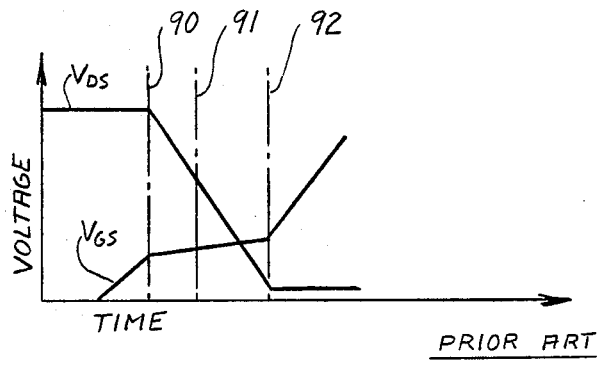
FIGS. 3 and 4 show gate-to-source and drain-to-source voltage waveforms vs. time for the prior art and this invention, respectively, which are useful in understanding the operation of the circuit of FIG. 1 and the difference between this circuit and the prior art.

When the freewheeling diodes recover and become reverse biased by a voltage equal to the threshold voltage of FET 38, the latter turns on and causes FET 50 to provide a shunt current path through diode 53 around resistor 46. This may be seen in FIG. 4 at the vertical dashed line 91 and the horizontal dashed line 95. With the 1K resistance of resistor 46 shunted, only the 100 ohm resistance of resistors 21 is left in the gate charging circuit for FETs 15–18. The tenfold increase in charging current greatly increases the speed of the switching process through the active conduction region of the FETs for minimum power dissipation therein; and the drain-to-source voltage $V_{DS}$ falls rapidly to its saturation level, as seen in FIG. 4. As already mentioned, this occurs only after the freewheeling diodes have recovered and are reverse biased, whereby the voltaqe transients produced are much lower in radio frequency components and RFI is reduced. It may be seen in FIG. 3 that voltage $V_{DS}$ for the prior art falls much more slowly and does not reach its saturation level until the time shown by vertical dashed line 92. This causes significantly greater power dissipation and consequent heat generation. As the voltage across FETs 15–18 continues to fall toward its saturation voltage, it eventually turns off FET 43 to turn on FET 55; but this has no effect on the circuit except to set it up for the turning off of FETs 15–18, yet to be described.

To turn off FETs 15–18, the voltage on junction 47 is switched low. The internal capacitances of FETs 15–18 start discharging through resistors 21, FET 55 and diode 48. This is a low resistance path, so the discharging is relatively fast and the voltage across FETs 15–18 quickly starts to rise as they come out of saturation. When it reaches the voltage effective to turn on FET 43, FET 55 is turned off after a propagation delay; and resistor 46 thus inserted in the discharge circuit. As a result of the propagation delay, the voltage across FETs 15–18 has risen by this time to within a few volts of B+ before the slowing begins. The switching process is then slowed by the high gate discharge resistance as the freewheeling diodes recover from reverse bias to forward bias.

An NPN bipolar transistor 60 has its collector connected to terminal B+, its base connected through a zener diode 61 (9.1 volt) to ground and through a resistor 62 (510 ohm) to terminal B+ and its emitter connected through a capacitor 63 (22 uF) to ground and to a terminal $V_c$. Terminal $V_c$ provides a more substantially regulated DC voltage for another portion of the circuit including comparators and other precision devices.

Terminal $V_c$ is connected to the collector of an NPN transistor 65 having an emitter connected to the emitter of a PNP transistor 66 having a grounded collector. The emitters of transistors 65 and 66 are connected to junction 47 to control the voltage thereon. The bases of transistors 65 and 66 are connected to the output of a comparator 67, which output is also connected to the collector of transistor 65 by a resistor 68 (4.7K).

The non-inverting input of comparator 67 is connected to the output of an oscillator. The oscillator comprises a capacitor 70 (0.01 uF) connected between ground and the inverting input of a comparator 71. Comparator 71 has a non-inverting input connected to the junction of a pair of resistors 72 and 73 (both 49.9K) and an output connected to terminal $V_c$ through a resistor 75 (2.7K) and to the non-inverting and inverting inputs by resistors 76 and 77 respectively (both 49.9K). The inverting input of comparator 71 comprises the output to comparator 67.

The inverting input of comparator 67 is connected to a voltage divider 78 connected between $V_c$ and ground and providing an adjustable reference voltage. The reference voltage may be modified, however, by a current sensing circuit to be described. The voltage across armature current sensing resistor 20 is applied through a low pass filter, comprising series resistor 80 (10K) and capacitor 81 (0.01 uF) to ground, to the non-inverting input of a comparator 82. A voltage divider 83 provides a current reference value indicative of maximum allowable current to the inverting input of comparator 82, which input is also filtered by a capacitor 85 (0.1 uF) to ground. The output of comparator 82 is connected to $V_c$ through a resistor 86 (2.0K) and through a diode 87, with a capacitor 88 (0.01 uF) to ground, to the inverting input of comparator 67. When the armature current exceeds the maximum allowable, comparator 82 sends its output upward to $V_c$, which removes voltage divider 78 from the circuit and causes comparator 67 to switch off transistor 65 and switch on transistor 66. This causes FETs 15–18 to be turned off. In the absence of such an overcurrent condition, however, the oscillator comprising comparator 71, capacitor 70 and their associated resistors causes comparator 67 to switch back and forth as the oscillator output exceeds and falls below the reference voltage from voltage divider 78. This produces, through the voltage applied to junction 47, the operation of the invention described at an earlier point in the specification. Finally, if desired, ceramic capacitors 98 and 99 (0.033 uF) may be connected to ground for AC power supply bypassing from the collector of transistor 65 and the $V_c$ power connection to the comparator chip(s), respectively.

The embodiments of the invention in which an exclusive property or privilege is claimed are defined as follows:

1. A switching circuit comprising, in combination:
 an electric power supply having a supply voltage;
 an inductive load with a parallel freewheeling diode, the freewheeling diode being of the type which becomes a momentary short circuit as it is changed from a forward to a reverse biased condition;
 a semiconductor switch connected in series with the inductive load across the electric power supply, the semiconductor switch having main electrodes and a control electrode defining a control voltage and further having internal capacitance between the control electrode and each of the main electrodes;
 switch control means effective to change the semiconductor switch from a nonconducting to a conducting state by sourcing current to the control electrode to charge the internal capacitance and raise the control voltage, the switch control means being responsive to the voltage across the load to produce a lower current rate to the control electrode while the voltage across the load indicates a condition other than reverse bias for the freewheeling diode in order to reduce RFI by slowing the switching of the semiconductor switch while the freewheeling diode is recovering and a higher current rate as soon as the voltage across the load indicates reverse bias for the freewheeling diode in order to minimize time spent in the active conduction region of the semiconductor switch and thus minimize resultant heat generation during switching.

2. The switching circuit of claim 1 wherein the switch control means includes apparatus effective to sense when the voltage across the load is at least as great as the threshold voltage of a semiconductor switch in the direction reverse biasing the freewheeling diode and reverse bias of the freewheeling diode is indicated or not indicated if this voltage is exceeded or not exceeded, respectively.

3. The switching circuit of claim 1 in which the switch control means comprises:
 means to source current from a terminal at a predetermined voltage, the voltage being switchable from a first voltage effective, when applied as the control voltage, to render the semiconductor switch nonconducting, to a second voltage effective, when applied as the control voltage, to render the semiconductor switch conducting;
 first and second resistances in series connecting the means to source current to the control electrode of the semiconductor switch, the first and second resistances in series producing the lower current rate to the control electrode, the second resistance being significantly smaller than the first resistance; and
 means responsive to the load voltage to shunt the first resistance and thus produce the higher current rate when the freewheeling diode has recovered to its reverse biased condition.

4. The switching circuit of claim 2 wherein the the semiconductor switch is a first semiconductor switch and in which the means responsive to the load voltage comprises a second semiconductor switch having a threshold voltage and having a control electrode and another electrode connected across the load to become conducting and thus generate a signal when the voltage across the load reaches the threshold voltage in the direction effective to reverse bias the freewheeling diode.

* * * * *